United States Patent
Murai et al.

(10) Patent No.: US 7,344,958 B2
(45) Date of Patent: Mar. 18, 2008

(54) METHOD FOR WAFER BONDING (Al, IN, GA)N AND ZN(S, SE) FOR OPTOELECTRONIC APPLICATIONS

(75) Inventors: Akihiko Murai, Goleta, CA (US); Lee McCarthy, Santa Barbara, CA (US); Umesh K. Mishra, Santa Barbara, CA (US); Steven P. DenBaars, Goleta, CA (US); Carsten Kruse, Bremen (DE); Stephan Figge, Bremen (DE); Detlef Hommel, Bremen (DE)

(73) Assignees: The Regents of the University of California, Oakland, CA (US); Universitaet Bremen (DE); Japan Science and Technology Agency (JP)

( * ) Notice: Subject to any disclaimer, the term of this patent is extended or adjusted under 35 U.S.C. 154(b) by 177 days.

(21) Appl. No.: 11/175,761

(22) Filed: Jul. 6, 2005

(65) Prior Publication Data
US 2006/0009006 A1 Jan. 12, 2006

Related U.S. Application Data

(60) Provisional application No. 60/585,673, filed on Jul. 6, 2004.

(51) Int. Cl.
*H01L 21/30* (2006.01)
*H01L 21/46* (2006.01)
(52) U.S. Cl. .................... 438/455; 438/22; 438/46; 438/47; 257/E21.482

(58) Field of Classification Search ........ 438/455–459; 257/E21.482
See application file for complete search history.

(56) References Cited

U.S. PATENT DOCUMENTS

| | | | | |
|---|---|---|---|---|
| 3,607,463 A | * | 9/1971 | Kinoshita et al. | 117/59 |
| 5,696,389 A | * | 12/1997 | Ishikawa et al. | 257/99 |
| 5,932,048 A | * | 8/1999 | Furukawa et al. | 156/153 |
| 6,998,281 B2 | * | 2/2006 | Taskar et al. | 438/29 |
| 7,119,271 B2 | * | 10/2006 | King et al. | 136/252 |
| 2003/0145884 A1 | | 8/2003 | King et al. | |
| 2005/0189551 A1 | * | 9/2005 | Peng et al. | 257/94 |

OTHER PUBLICATIONS

Sink et al., "Cleaved GaN facets by wafer fusion of GaN to InP", Appl. Phys. Lett. 68 (15) (Apr. 8, 1996).
Kish et al., "Very high-efficienty semiconductor wafer-bonded transparent-substrate $(Al,Ga_{1-x})_{0.5}In_{0.5}P/GaP$ light-emitting diodes", Appl. Phys. Lett. 64 (21) (1994).
Smathers et al., "Nanometer scale surface clustering on ZnSc epilayers", Applied Physics Letters, vol. 72 No. 10 (Mar. 9, 1998).

(Continued)

*Primary Examiner*—Michael Lebentritt
*Assistant Examiner*—Angel Roman
(74) *Attorney, Agent, or Firm*—Gates & Cooper LLP

(57) ABSTRACT

A method for producing a wafer bonded structure between (Al, In, Ga)N and Zn(S,Se). A highly reflective and conductive distributed Bragg reflector (DBR) for relatively short optical wave lengths can be fabricated using Zn(S,Se) and MgS/(Zn, Cd)Se materials. Using wafer bonding techniques, these high-quality DBR structures can be combined with a GaN-based optical device structure.

17 Claims, 6 Drawing Sheets

OTHER PUBLICATIONS

Carlin et al., "High-quality AlInN for high index contrast Bragg mirrors lattice matched to GaN", Applied Physics Letters, vol. 83 No. 4 (Jul. 28, 2003).

Liau et al., "Wafer fusion: A novel technique for optoelectronic device fabrication and monolithic integration", Appl. Phys. Lett. 56 (8) (Feb. 19, 1990).

Someya et al., "Highly reflective GaN/$Al_{0.34}Gn_{0.66}$N quarrer-wave reflectors grown by metal organic chemical vapor deposition", Appl. Phys. Lett., vol. 73 No. 25 (Dec. 21, 1998).

Jasinski et al., "Microstructure of GaAs/GaN interfaces produced by dircer wafer fusion", Appl. Phys. Lett., vol. 81 No. 17 (Oct. 21, 2002).

* cited by examiner

5um

5um

5um

5um

METHOD FOR WAFER BONDING (Al, IN, GA)N AND ZN(S, SE) FOR OPTOELECTRONIC APPLICATIONS

CROSS-REFERENCE TO RELATED APPLICATIONS

This application claims the benefit under 35 U.S.C. Section 119(e) of the following co-pending and commonly-assigned patent application:

U.S. Provisional Patent Application Ser. No. 60/585,673, filed on Jul. 6, 2004, by Stephan Figge, Carsten Kruse, Akihiko Murai, Detlef Hommel, Lee McCarthy, Umesh K. Mishra and Steven P. DenBaars, entitled "METHOD FOR WAFER BONDING (Al, In, Ga)N AND Zn(S, Se) FOR OPTOELECTRONIC APPLICATIONS,";

which application is incorporated by reference herein.

BACKGROUND OF THE INVENTION

1. Field of the Invention

This invention is related to wafer bonding for optoelectronic applications. More particularly, the invention relates to wafer bonding (Al, In, Ga)N and Zn(S, Se) for optoelectronic applications.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.) Wafer bonding technology using a different combination of materials such as InP/GaAs, $(Al_xGa_{1-x})_{0.5}In_{0.5}P/GaP$, InP/GaN, GaAs/GaN have been studied for applications of optoelectronic integration, light-emitting diodes (LEDs), vertical cavity surface emitting lasers (VCSELs) and electronic devices. [1,2,3,4].

In the nitride material system, there are several challenges in fabricating distributed Bragg reflector (DBR) structures. The general approach is to epitaxially grow a structure made up of alternating quarter-wavelength GaN and AlGaN layers. Because of the 2.5% lattice mismatch between GaN and AlN, the AlN content of the ternary material has to kept low in order to avoid cracks in the layers, which causes a large number of mirror pairs in order to reach a high reflectivity, and the width of the reflectivity stop-band is quite narrow. [5].

Another approach is the method of using an AlInN/GaN combination to avoid the generation of cracks. [6]. But, these approaches continue to have difficulty in fabricating conductive DBRs, especially a conductive p-type DBR structure.

What is needed, however, are improved methods of wafer bonding for optoelectronic applications. The present invention satisfies this need.

SUMMARY OF THE INVENTION

A method for producing a fused structure between (Al, In, Ga)N and Zn(S, Se). A highly reflective and conductive distributed Bragg reflector (DBR) for relatively short optical wave lengths can be fabricated using Zn(S, Se) and MgS/(Zn, Cd)Se materials. Using wafer bonding techniques, this DBR can be combined with a GaN-based optical device structure.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention provides a method of producing a fused or bonded structure between (Al, In, Ga)N and Zn(S, Se). Fabricating highly reflective and conductive DBR structures using (Al, Ga)N materials, especially p-type conductive DBR fabrication, is difficult. Currently, a metal (e.g., Ag or Ni) is used for the mirror, the reflectivity of which is less than 90% for optical wavelengths of less than 500 nm. On the other hand, a highly reflective and conductive DBR of relatively short optical wavelength between 460 nm and 620 nm can be fabricated using Zn(S, Se) and MgS/(Zn, Cd)Se materials. Using wafer bonding (fusion) techniques, a high-quality DBR structure, with a reflectivity of more than 99%, can be set into the GaN-based optical device structure. By increasing reflectivity, thus enhancing light extraction, subsequent device performance is expected to increase. Potential optical devices with fusion structures include light emitting diodes (LEDs), resonant-cavity LEDs (RC-LEDs), and vertical cavity surface emitting lasers (VCSELs). The integration of highly conductive p-type mirror layers to GaN is novel and has advantages over existing high-brightness LEDs (HB-LEDs) designs.

Wafer Bonding Method

The present invention is comprised of two steps for the wafer bonding of (Al, In, Ga)N and Zn(S, Se).

The first step is the preparation of a flat and clean surface of both wafer surfaces to be bonded.

Concerning the Zn(S, Se), the layer is grown by molecular beam epitaxy (MBE) on (001) GaAs. After growth, the wafer is planarized using a combination of thermal annealing and chemical-mechanical polishing, and is cleaned using several solvents.

Concerning the (Al, In, Ga)N, the layer is grown using metal-organic chemical vapor deposition (MOCVD) on c-plane (0001) sapphire. After growth, the wafer is cleaned using several solvents and is oxidized in an oxygen plasma followed by oxide removal in HCl.

The second step is a wafer bonding process between (Al, In, Ga)N and Zn(S, Se). The two wafers are joined together and then bonded in a nitrogen ambient under uniaxial pressure at a set temperature for a set duration.

Experimental Results

Figure 1:
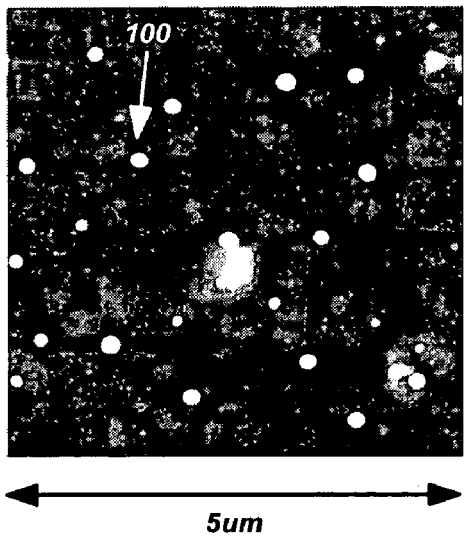
FIG. 1 is an atomic force microscope (AFM) image of the surface morphology of the ZnSSe wafer showing the type A bumps present on the surface.
Figure 2:
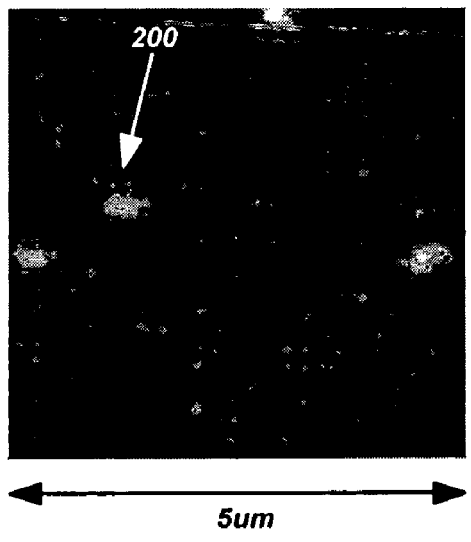
FIG. 2 is an AFM image of the surface morphology of the ZnSSe wafer showing the type B bumps present on the surface.
Figure 3:
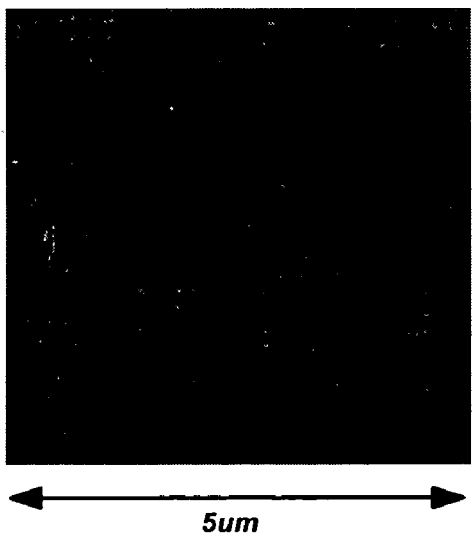
FIG. 3 is an AFM image of the surface morphology of the ZnSSe wafer after a second annealing step obtains a surface suitable for wafer bonding.
Figure 4:
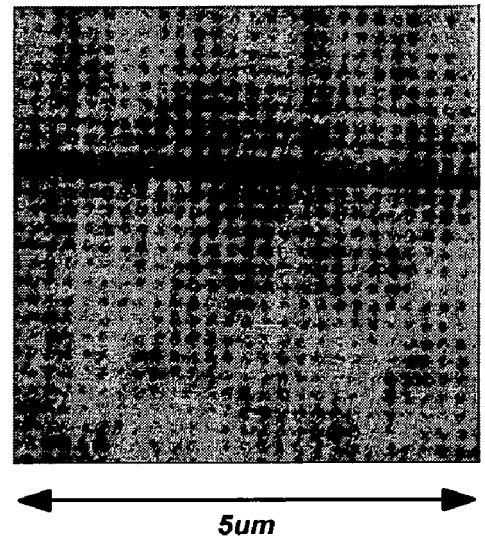
FIG. 4 is an AFM image of the surface morphology of the AlGaInN wafer.
Figure 5:
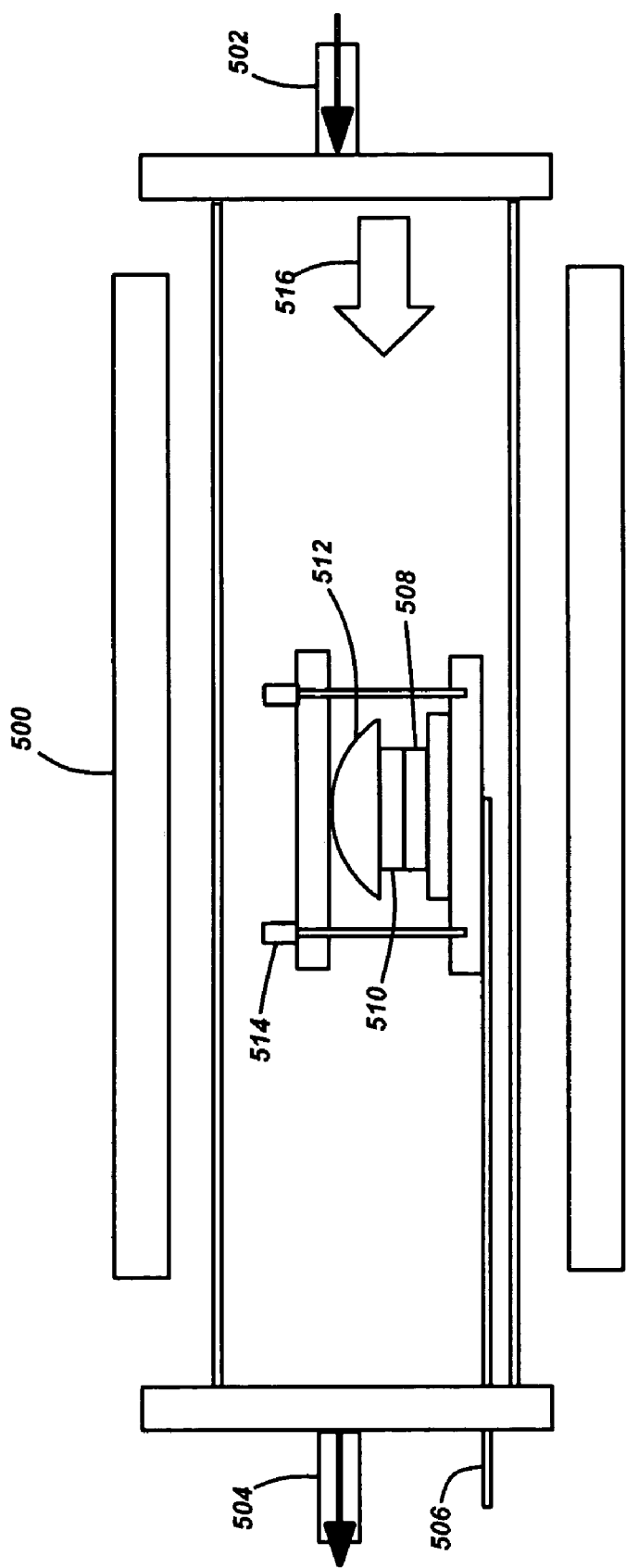
FIG. 5 is a block diagram illustrating the wafer bonding furnace, graphite boat and screw configuration.
Figure 6:
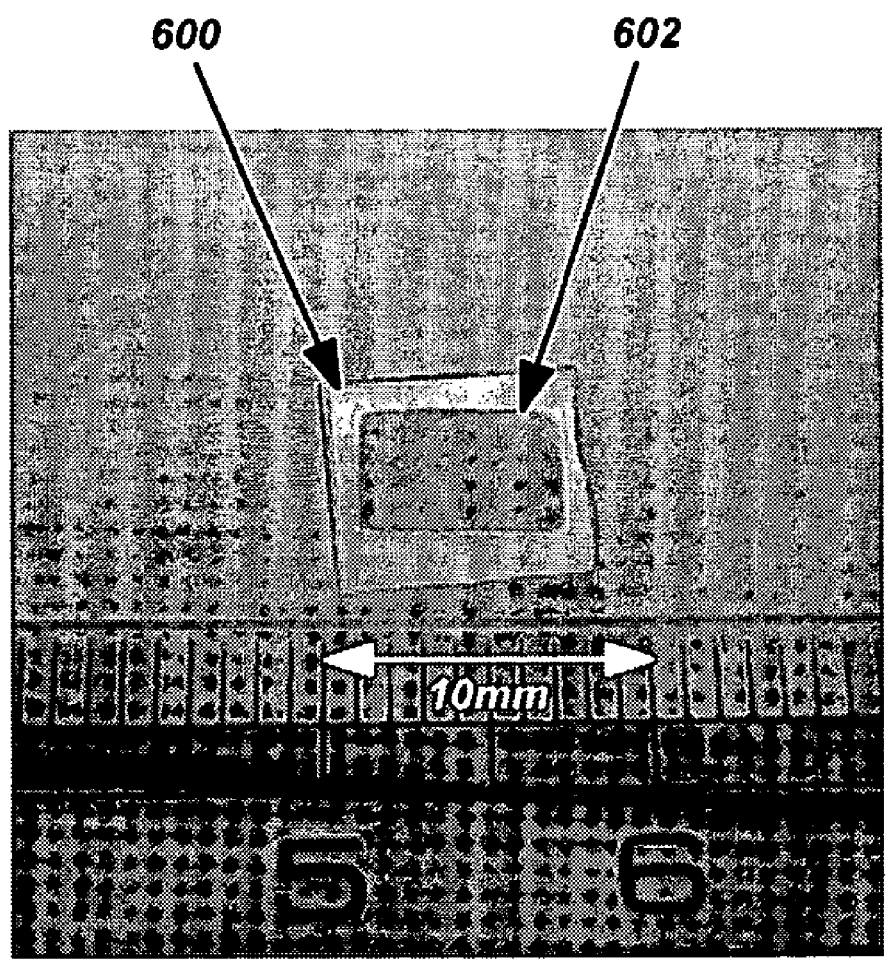
FIGS. 6 and 7 are photographs of wafer bonded samples.
Figure 7:
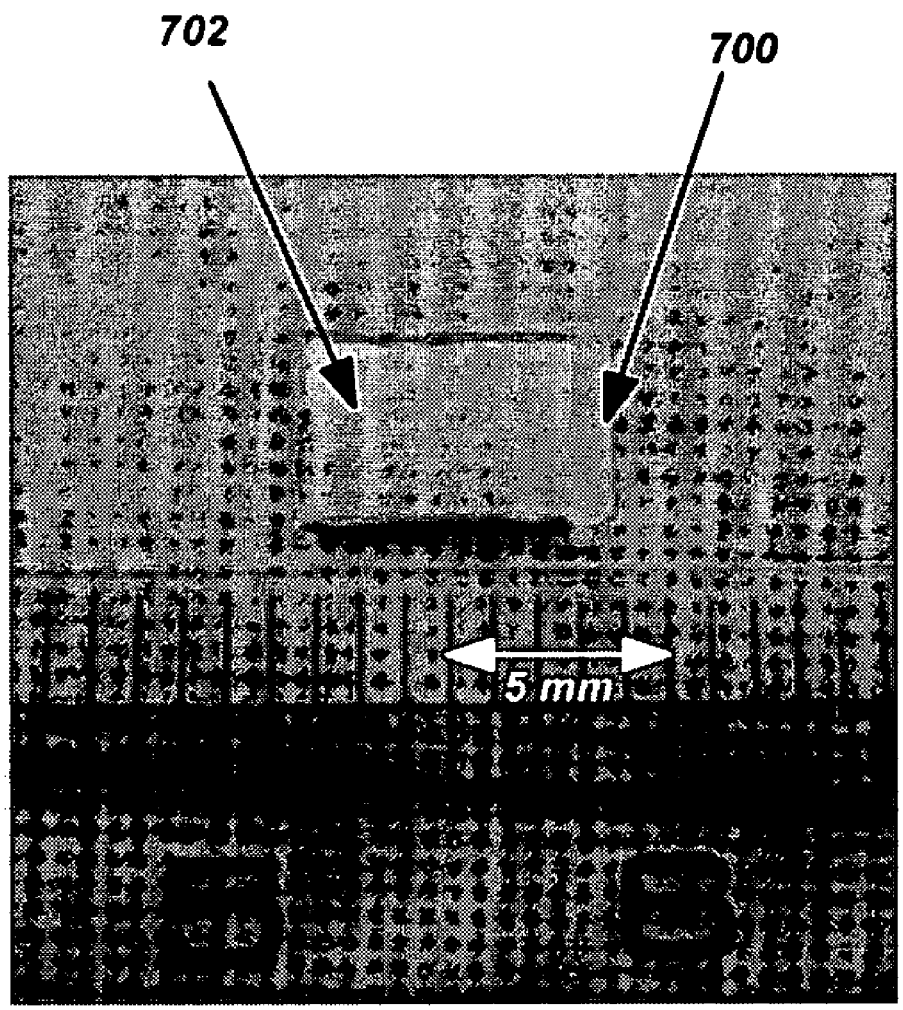
Figure 8:
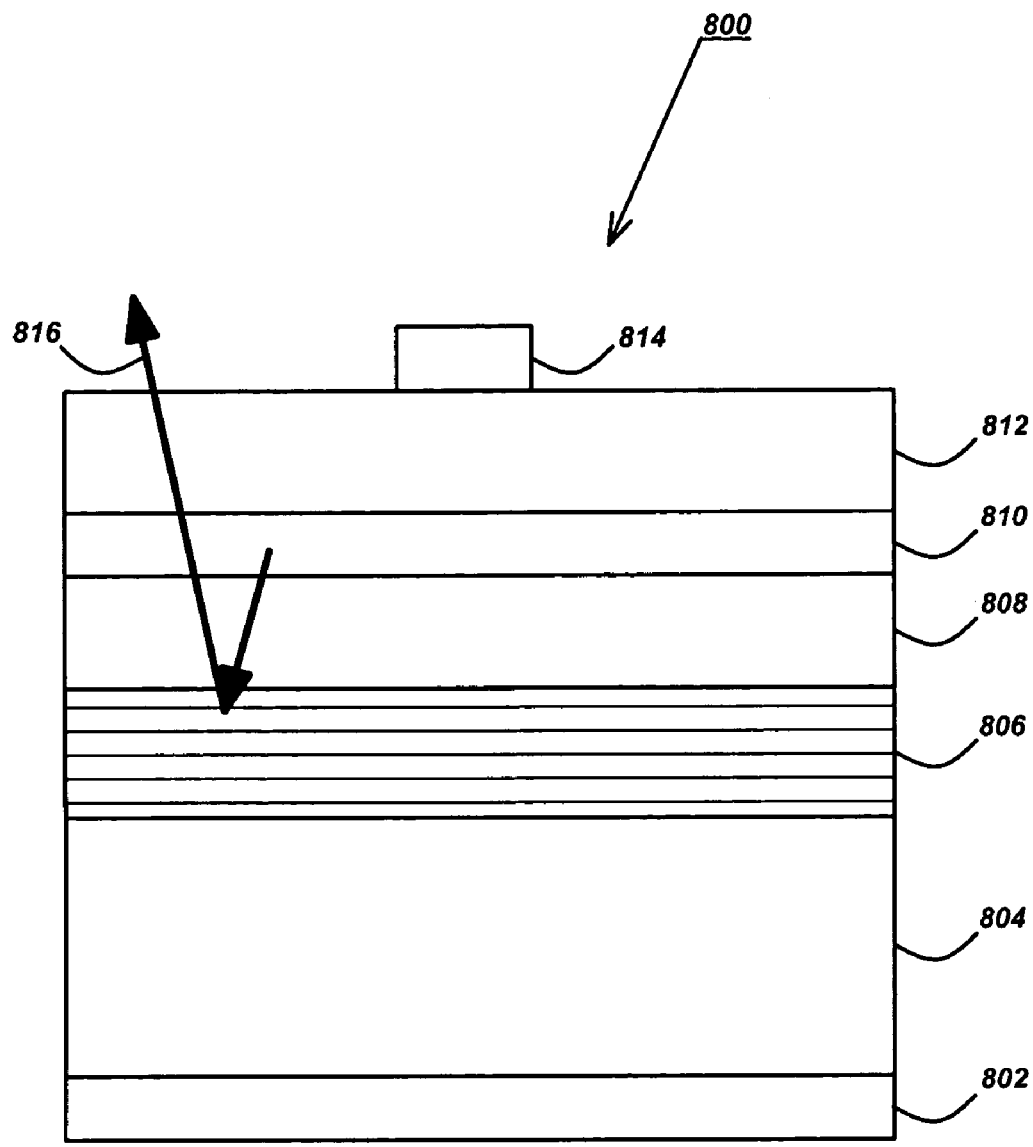
FIG. 8 is a block diagram illustrating a possible device structure including a GaN-based active layer and DBR structure.

The surface of ZnSSe has two types of uneven microscopic structures or bumps, type A and type B, which must be removed to obtain a flat surface for fusion. The surface morphology of the material as-grown after exposure to an oxygen-containing atmosphere is shown in FIG. 1, which was obtained using an atomic force microscope (AFM). The origin of the type A bumps 100 is thought to be $SeO_2$, which is generated just after the surface exposure to the atmosphere. [7]. The typical size of type A bumps 100 is 40-120 nm in diameter and 6-20 nm in height. These bumps 100 are removed by annealing at 180° C. for 1 hour in a nitrogen atmosphere, as shown in FIG. 2. Subsequently, the type B bumps 200 shown in FIG. 2, the size of which are 0.5-1.0 µm in width and 5-20 nm in height, are removed by polishing the wafer using a colloidal silica suspension and polishing cloth. Just after polishing, newly generated type A bumps 100 appear. To remove the newly generated bumps, a second annealing step is performed at the same conditions as the first annealing step. After this second annealing step, a surface suitable for wafer bonding is obtained, as shown in FIG. 3. The surface of AlGaInN as-grown by MOCVD is relatively smooth, as shown in FIG. 4, and surface polishing is not required. In the next step, shown in FIG. 5, which illustrates a furnace 500 having an input 502 and an exhaust 504, as well as a thermocouple 506, the ZnSSe wafer 508 and AlGaInN wafer 510 are joined together under uniaxial pressure of 2 MPa using a graphite boat 512 and screw 514 configuration, which is then loaded into the wafer bonding furnace 500. The furnace 500 is heated to a temperature of 270° C. for 1 hour with an $N_2$ flow 516. For p-type DBRs, the temperature should be less than 270° C. to prevent dissociation of the p-type dopant (N) in ZnSSe. Photographs of wafer bonded samples are shown in FIG. 6 and FIG. 7. In FIG. 6, the $Al_{0.2}Ga_{0.8}N$ layer on sapphire substrate 600 (upper wafer) and the $ZnS_{0.06}Se_{0.94}$ layer on GaAs substrate 602 (lower wafer) are wafer bonded. In FIG. 7, the $Al_{0.2}Ga_{0.8}N$ layer on sapphire substrate 700 (upper wafer) and the DBR layer 702 comprised of $ZnS_{0.04}Se_{0.96}$ (high index) and MgS/ZnCdSe-super lattice (low index) on GaAs substrate (lower wafer) are wafer bonded. FIG. 8 shows a possible final device structure 800, including an electrode 802, conductive semiconductor 804, p-type DBR structure 806 using Zn(S, Se) and MgS/(Zn, Cd)Se, p-type layer 808, active nitride (GaN-based) layer 810, n-type nitride layer 812 and electrode 814, wherein the arrows 816 indicate extracted light.

Possible Modifications and Variations

The crucial aspects of wafer bonding between (Al, In, Ga)N and Zn(S, Se) are the surface flatness and cleanliness. A variety of planarization and surface cleaning techniques may be employed to prepare an ideal surface for wafer bonding. Sufficient control of the crystal growth is also required in order to achieve a planar surface. Surface preparation techniques for the Zn(S, Se) that avoid contact with an oxygen containing atmosphere and result in a non-oxidized surface, constitute a potential modification of this invention.

Other gases such as $H_2$ can also be used for an atmosphere during the wafer bonding process. Vacuum conditions can also be used during the wafer bonding process.

Also, improvements in attaining a planar (Al, In, Ga)N surface using polishing or epitaxial growth techniques will result in more uniform fusion.

Concerning the growth method of Zn(S, Se) layers, other techniques such as MOCVD may also be used.

Another kind of substrate, such as an ZnSe, InP or ZnTe substrate, can be used for Zn(S, Se) layer growth. Moreover, another kind of crystalline plane, such as (111) or (311) planes, can be also used for Zn(S, Se) layer growth.

A variety of II-VI compound semiconductor layers, such as (Zn, Mg, Cd)(S, Se), can be used for wafer bonding.

The (Al, In, Ga)N layer may be grown by MBE.

Different substrates, such as SiC or AlN or GaN substrates, can be used for layer growth.

Different crystalline planes, such as the a-plane or m-plane, can be also used for (Al, Ga, In)N layer growth.

Concerning the DBR stop band wavelength using Zn(S, Se) and MgS/(Zn, Cd)Se materials, a shorter wavelength than 460 nm may be fabricated by optimizing crystal growth conditions and materials used. FIG. 8 shows an example of a II-VI compound semiconductor based DBR structure integrated with a III-N compound semiconductor based LED. By the use of highly reflective DBR structures, the emitted light from the active region can be extracted efficiently and heat generation can also be decreased. Of course, applications to RC-LEDs and VCSELs, among others, are also possible.

Advantages and Improvements

This method for bonding (Al, In, Ga)N and Zn(S, Se) wafers is novel and has advantages over existing device designs. Concerning optical device applications, a DBR set in a structure fabricated by this invention has the primary advantage over existing structures using metal mirrors in terms of higher efficiency due to increased light extraction, and greater reliability due to enhanced thermal dissipation over devices grown on sapphire substrates and decreasing heat generation. The resulting external quantum efficiency of this new hybrid GaN/ZnSe design should be higher than that of existing GaN-based devices.

Process Steps

Figure 9:
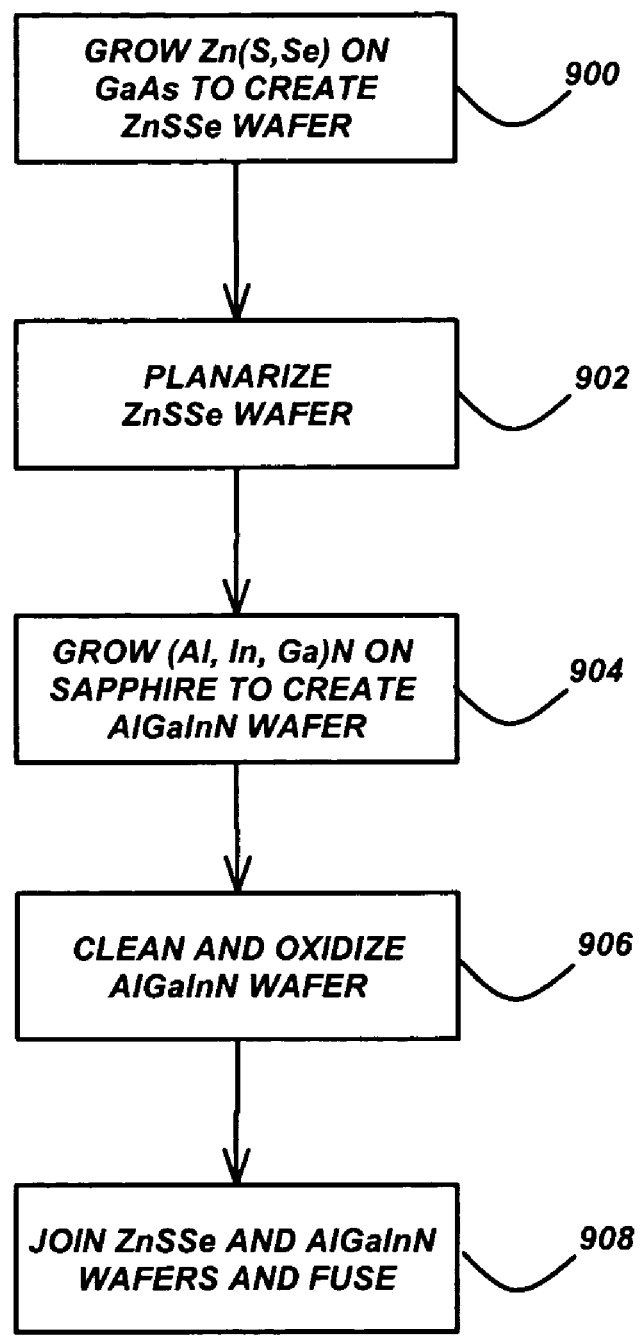
FIG. 9 is a flowchart that further illustrates the process steps for wafer bonding, according to the preferred embodiment of the present invention.

FIG. 9 is a flowchart that further illustrates the process steps for wafer bonding, according to the preferred embodiment of the present invention.

Block 900 represents growing Zn(S, Se) on (001) GaAs to create a ZnSSe wafer using molecular beam epitaxy (MBE).

Block 902 represents planarizing and cleaning the ZnSSe wafer using thermal annealing and chemical-mechanical polishing, followed by the use of solvents. A surface of the ZnSSe wafer has type A and B bumps that must be removed to obtain a flat surface for fusing the wafers after joining. The type A bumps are removed from the ZnSSe wafer by a first annealing step performed on the ZnSSe wafer at 180° C. for 1 hour in a nitrogen atmosphere. The type B bumps are removed from the ZnSSe wafer by polishing the ZnSSe wafer after the first annealing step is performed using a colloidal silica suspension and polishing cloth. Newly generated type A bumps appear on the ZnSSe wafer after polishing, and the newly generated type A bumps are removed from the ZnSSe wafer using a second annealing step performed on the ZnSSe wafer at 180° C. for 1 hour in a nitrogen atmosphere, resulting in a surface suitable for bonding.

Block 904 represents growing (Al, In, Ga)N on c-plane (001) sapphire to create an AlGaInN wafer using metal-organic chemical vapor deposition (MOCVD).

Block 906 represents cleaning and oxidizing the AlGaInN wafer. The AlGaInN wafer is cleaned using several solvents and oxidized in an oxygen plasma followed by oxide removal in HCl.

Block 908 represents joining the ZnSSe and AlGaInN wafers together and fusing the joined wafers. The ZnSSe wafer and AlGaInN wafer are joined together under uniaxial pressure of 2 MPa using a graphite boat and screw configuration. The joined wafers are fused or bonded in a nitrogen ambient under uniaxial pressure at a set temperature for a set duration. Specifically, the joined wafers are loaded into a wafer bonding furnace, and the furnace is heated to a temperature of 270° C. for 1 hour in a $N_2$ flow.

The end result of these process steps is a device comprised of bonded wafers including a high-quality DBR structure set in the Zn(S, Se).

REFERENCES

The following references are incorporated by reference herein:
1. Appl. Phys. Lett. 56, 737-39 (1990).
2. Appl. Phys. Lett. 64, 2839-41 (1994).
3. Appl. Phys. Lett. 68, 2147 (1996).
4. Appl. Phys. Lett. 81, 3152-54 (2002).
5. Appl. Phys. Lett. 73, 3653-3655 (1988).
6. Appl. Phys. Lett. 83, 668-670 (2003).
7. Appl. Phys. Lett. 72, 1238-40 (1998).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for wafer bonding, comprising:
   (a) creating a ZnSSe wafer by growing Zn(S, Se) on GaAs;
   (b) creating an AlGaInN wafer by growing (Al, In, Ga)N on sapphire; and
   (c) joining the ZnSSe and AlGaInN wafers together and fusing the joined ZnSSe and AlGaInN wafers.

2. The method of claim 1, wherein the ZnSSe wafer is planarized and cleaned before the joining and fusing.

3. The method of claim 1, wherein the Zn(S, Se) is grown using molecular beam epitaxy (MBE).

4. The method of claim 1, wherein the GaAs is (001) GaAs.

5. The method of claim 1, further comprising fabricating a distributed Bragg reflector (DBR) structure set in the Zn(S, Se).

6. The method of claim 1, wherein the AlGaInN wafer is cleaned before the joining and fusing.

7. The method of claim 1, wherein the (Al, In, Ga)N is grown using metal-organic chemical vapor deposition (MOCVD).

8. The method of claim 1, wherein the sapphire is c-plane (0001) sapphire.

9. The method of claim 1, wherein the ZnSSe wafer is planarized using thermal annealing and chemical-mechanical polishing.

10. The method of claim 9, wherein a surface of the ZnSSe wafer has type A and B bumps that must be removed to obtain a flat surface for the fusing step.

11. The method of claim 10, wherein the type A bumps are removed from the ZnSSe wafer by a first annealing step performed on the ZnSSe wafer at 180° C. for 1 hour in a nitrogen atmosphere.

12. The method of claim 11, wherein the type B bumps are removed from the ZnSSe wafer by polishing the ZnSSe wafer after the first annealing step is performed using a colloidal silica suspension and polishing cloth.

13. The method of claim 12, wherein newly generated type A bumps appear on the ZnSSe wafer after polishing, and the newly generated type A bumps are removed from the ZnSSe wafer using a second annealing step performed on the ZnSSe wafer at 180° C. for 1 hour in a nitrogen atmosphere, resulting in a surface suitable for bonding.

14. The method of claim 1, wherein the AlGaInN wafer is oxidized in an oxygen plasma followed by oxide removal in HCl.

15. The method of claim 1, wherein the ZnSSe wafer and AlGaInN wafer are joined together under uniaxial pressure of 2 MPa using a graphite boat and screw configuration.

16. The method of claim 1, wherein the joined wafers are wafer bonded in a nitrogen ambient under uniaxial pressure at a set temperature for a set duration.

17. The method of claim 16, wherein the joined wafers are loaded into a wafer bonding furnace, and the furnace is heated to a temperature of 270° C. for 1 hour in a $N_2$ flow.

* * * * *